United States Patent
Kim et al.

(10) Patent No.: US 9,524,929 B2
(45) Date of Patent: Dec. 20, 2016

(54) SEMICONDUCTOR MODULE PACKAGE AND METHOD OF MANUFACTURING THE SAME

(71) Applicant: SAMSUNG ELECTRO-MECHANICS CO., LTD., Suwon-Si (KR)

(72) Inventors: Kwang Soo Kim, Suwon-Si (KR); Joon Seok Chae, Suwon-Si (KR); Suk Ho Lee, Suwon-Si (KR)

(73) Assignee: Samsung Electro-Mechanics Co., Ltd., Gyeonggi-do (KR)

( * ) Notice: Subject to any disclaimer, the term of this patent is extended or adjusted under 35 U.S.C. 154(b) by 200 days.

(21) Appl. No.: 14/499,181

(22) Filed: Sep. 28, 2014

(65) Prior Publication Data
US 2015/0270207 A1 Sep. 24, 2015

(30) Foreign Application Priority Data
Mar. 18, 2014 (KR) .................. 10-2014-0031804

(51) Int. Cl.
*H01L 23/495* (2006.01)
*H01L 23/538* (2006.01)
(Continued)

(52) U.S. Cl.
CPC ..... *H01L 23/49575* (2013.01); *H01L 23/4334* (2013.01); *H01L 23/49551* (2013.01); *H01L 23/49562* (2013.01); *H01L 23/5384* (2013.01); *H01L 24/32* (2013.01); *H01L 24/37* (2013.01); *H01L 24/40* (2013.01); *H01L 24/73* (2013.01); *H01L 24/83* (2013.01); *H01L 24/84* (2013.01); *H01L 24/92* (2013.01); *H01L 25/0655* (2013.01); *H01L 25/50* (2013.01); *H01L 23/49524* (2013.01); *H01L 24/27* (2013.01); *H01L 24/29* (2013.01); *H01L 24/35* (2013.01); *H01L 24/48* (2013.01); *H01L 24/85* (2013.01); *H01L 2224/26135* (2013.01); *H01L 2224/26145* (2013.01); *H01L 2224/27312* (2013.01); *H01L 2224/27334* (2013.01); *H01L 2224/293* (2013.01); *H01L 2224/2919* (2013.01); *H01L 2224/2929* (2013.01); *H01L 2224/29083* (2013.01); *H01L 2224/29291* (2013.01); *H01L 2224/3201* (2013.01);
(Continued)

(58) Field of Classification Search
CPC ......... H01L 23/495–23/49596; H01L 21/4867; H01L 21/4875; H01L 2021/60; H01L 2021/60007; H01L 2021/60277
USPC ........................... 438/106–127; 257/666–796
See application file for complete search history.

(56) References Cited

U.S. PATENT DOCUMENTS

2013/0221513 A1 8/2013 Borghoff
2013/0307130 A1* 11/2013 Oga ................. H01L 24/73
257/666

OTHER PUBLICATIONS

Stic search report Jun. 10, 2016, pp. 1-18.*

* cited by examiner

*Primary Examiner* — Jessica Manno
*Assistant Examiner* — Delma R Forde
(74) *Attorney, Agent, or Firm* — Ladas & Parry, LLP (57) ABSTRACT

There is provided a semiconductor module package including: a base substrate formed by mounting one or more first semiconductor devices thereon; a lead frame formed on a top surface of the first semiconductor device and having an inlet formed to inject a solder paste; and spaces inserted between the first semiconductor device and the lead frame to form a separation space, wherein the solder paste is filled in the separation space.

15 Claims, 7 Drawing Sheets

(51) Int. Cl.
*H01L 25/00* (2006.01)
*H01L 25/065* (2006.01)
*H01L 23/433* (2006.01)
*H01L 23/00* (2006.01)

(52) U.S. Cl.
CPC ............... *H01L 2224/32145* (2013.01); *H01L 2224/32227* (2013.01); *H01L 2224/32257* (2013.01); *H01L 2224/35847* (2013.01); *H01L 2224/37005* (2013.01); *H01L 2224/37011* (2013.01); *H01L 2224/37013* (2013.01); *H01L 2224/37147* (2013.01); *H01L 2224/4007* (2013.01); *H01L 2224/40105* (2013.01); *H01L 2224/40137* (2013.01); *H01L 2224/40227* (2013.01); *H01L 2224/40499* (2013.01); *H01L 2224/40991* (2013.01); *H01L 2224/40993* (2013.01); *H01L 2224/48091* (2013.01); *H01L 2224/48111* (2013.01); *H01L 2224/48137* (2013.01); *H01L 2224/73215* (2013.01); *H01L 2224/73221* (2013.01); *H01L 2224/73263* (2013.01); *H01L 2224/73265* (2013.01); *H01L 2224/73271* (2013.01); *H01L 2224/831* (2013.01); *H01L 2224/83007* (2013.01); *H01L 2224/83136* (2013.01); *H01L 2224/83139* (2013.01); *H01L 2224/83447* (2013.01); *H01L 2224/83815* (2013.01); *H01L 2224/84007* (2013.01); *H01L 2224/84136* (2013.01); *H01L 2224/84138* (2013.01); *H01L 2224/84815* (2013.01); *H01L 2224/92157* (2013.01); *H01L 2224/92165* (2013.01); *H01L 2224/92166* (2013.01); *H01L 2224/92246* (2013.01); *H01L 2224/92247* (2013.01); *H01L 2924/00014* (2013.01); *H01L 2924/01014* (2013.01); *H01L 2924/01015* (2013.01); *H01L 2924/01028* (2013.01); *H01L 2924/01029* (2013.01); *H01L 2924/0665* (2013.01); *H01L 2924/13055* (2013.01); *H01L 2924/13091* (2013.01); *H01L 2924/15153* (2013.01); *H01L 2924/181* (2013.01)

SEMICONDUCTOR MODULE PACKAGE AND METHOD OF MANUFACTURING THE SAME

CROSS-REFERENCE TO RELATED APPLICATION

This application claims the benefit of Korean Patent Application No. 10-2014-0031804, filed on Mar. 18, 2014, entitled "Semiconductor Module Package and Method of Manufacturing the Same" which is hereby incorporated by reference in its entirety into this application.

BACKGROUND

The present disclosure relates to a semiconductor module package and a method of manufacturing the same.

In accordance with an increase in energy consumption around the world, an efficient use of restricted energy has been attracting much attention. Therefore, a use of an inverter adopting an intelligent power module (IPM) for efficiently performing power conversion of energy in the existing home and industrial appliances has accelerated. Since the inverter is directly related to reliability of a power semiconductor module, which is a key component, and performance of heat dissipation of the power semiconductor module, it has been highlighted as an importance issue together with high integration, high capacity, miniaturization, and high efficiency.

Regarding the reliability issue, a semiconductor device and a connecting terminal part are electrically connected by a wire bonding scheme. In this case, the wire bonding scheme frequently occurs fails due to a coefficient of thermal expansion (CTE) and heat of the semiconductor device and the wire.

Recently, a research into a direct lead bonding method has been conducted to remove the wire bonding the semiconductor device. However, according to the lead bonding method, since a plurality of power semiconductors are mounted, a height difference has been generated. For example, among the power semiconductor devices, an insulated gate bipolar transistor (IGBT) has a step of 70 μm and a fast recovery diode (FRD) has the step of 150 μm to 200 μm. Therefore, problems such as a step adjusting problem upon manufacturing a lead frame, a process fail caused by stress against the lead frame directly bonded to the device, and the like have occurred.

RELATED ART DOCUMENT

Patent Document (Patent Document 1) US2013-0221513 A1

SUMMARY

An aspect of the present disclosure may provide a semiconductor module package capable of preventing damage for a semiconductor device caused by a high temperature generated at the time of bonding a solder paste by forming a space between the semiconductor device and a lead frame.

According to an aspect of the present disclosure, a semiconductor module package may include: a base substrate formed by mounting one or more first semiconductor devices thereon; a lead frame formed on a top surface of the first semiconductor device and having an inlet formed to inject a solder paste; and spaces inserted between the first semiconductor device and the lead frame to form a separation space, wherein the solder paste is filled in the separation space.

The lead frame may include: an inlet injecting the solder paste; and a through via formed in a lower end portion of the inlet and allowing the solder paste to flow out.

The lead frame may be formed by being bent to correspond to top surfaces of one or more of the first semiconductor devices and may be formed so that a second semiconductor device is inserted into the inlet.

The spaces may be formed along an outer peripheral surface of the through via and may be formed to have the same height.

The space may be made of a material having adhesion on both surfaces thereof.

The space may be formed to be removable.

The space may be formed integrally with the lead frame and may have an adhesive formed on a lower end portion thereof.

The lead frame and the space may have an adjusting member formed therebetween, and the adjusting member may have one or more through via holes formed therein.

The adjusting member may be formed to correspond to the space and allow a constant height that the solder paste is filled to be formed.

According to another aspect of the present disclosure, a method of manufacturing a semiconductor module package may include: preparing a base substrate on which one or more first semiconductor devices are mounted; attaching a space to an upper end of the first semiconductor device along a mounting portion; allowing a lead frame to be in contact with an upper end portion of the space; injecting a solder paste into an inlet of the lead frame; and filling, by the solder paste, a distance between the first semiconductor device and the lead frame.

The method may further include, after the filling, by the solder paste, of the distance between the first semiconductor device and the lead frame, inserting and fixing a second semiconductor device into the inlet.

In the injecting of the solder paste into an inlet of the lead frame, the solder paste may be made of an epoxy resin and a silicon resin.

The allowing of the lead frame to be in contact with an upper end portion of the space may include bending a portion of the lead frame by performing a trimming process and a forming process for the portion of the lead frame.

The electrically connecting of the second semiconductor device to the first semiconductor device and the lead frame may include electrically connecting the second semiconductor device to the first semiconductor device and the lead frame using a wire.

The attaching of the space to an upper end of the first semiconductor device along a mounting portion may include attaching the space using a double adhesive.

The attaching of the space to an upper end of the first semiconductor device along a mounting portion may include attaching the space using an optical clear adhesive (OCA) and a double adhesive tape (DAT).

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

The objects, features and advantages of the present disclosure will be more clearly understood from the following detailed description of the exemplary embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present disclosure, when it is determined that the detailed description of the related art would obscure the gist of the present disclosure, the description thereof will be omitted.

Figure 1:
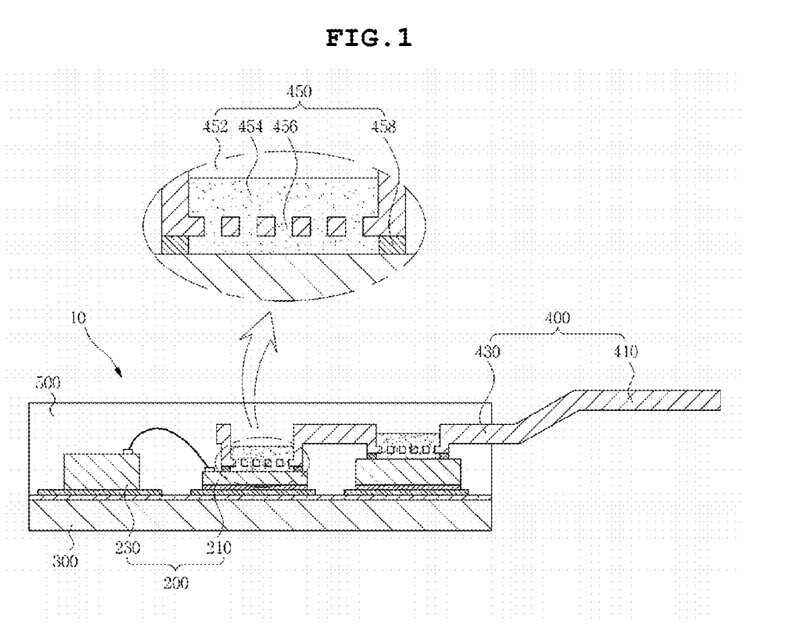
FIG. 1 is a cross-sectional view of a semiconductor module package according to an exemplary embodiment of the present disclosure.
Figure 2:
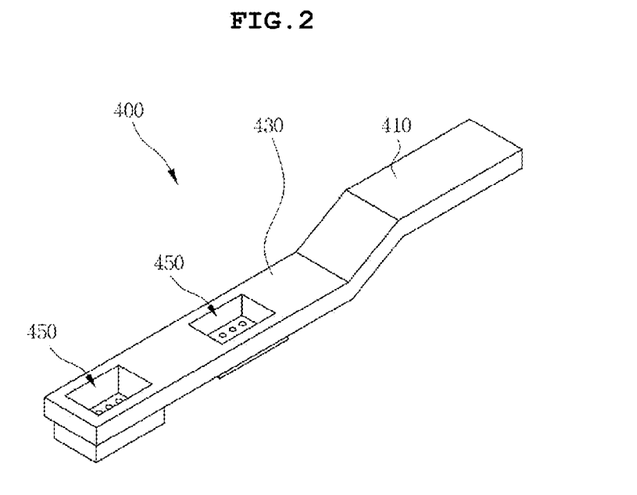
FIG. 2 is a perspective view of a lead frame of FIG. 1.
Figure 3:
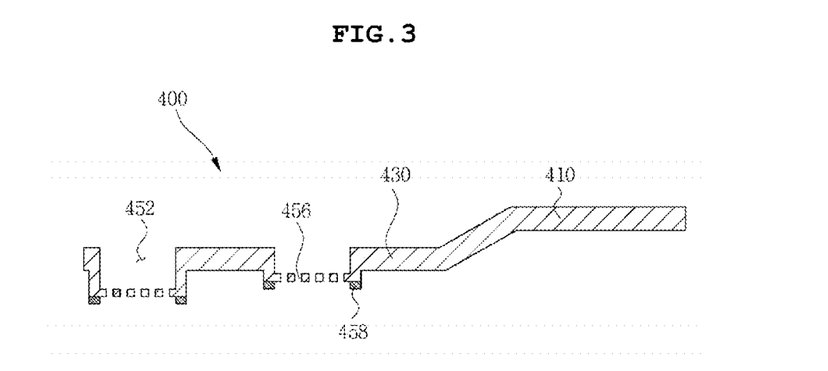
FIG. 3 is a view illustrating a cross section of the lead frame of FIG. 2.
Figure 4:
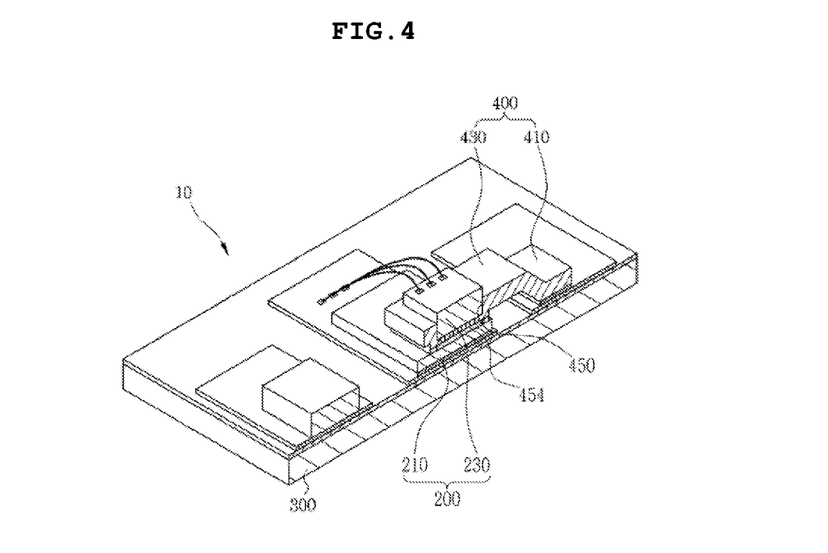
FIG. 4 is a cross-sectional view illustrating a case in which a semiconductor device is inserted into a slit space according to deformation of the semiconductor module package of FIG. 1.
Figure 5:
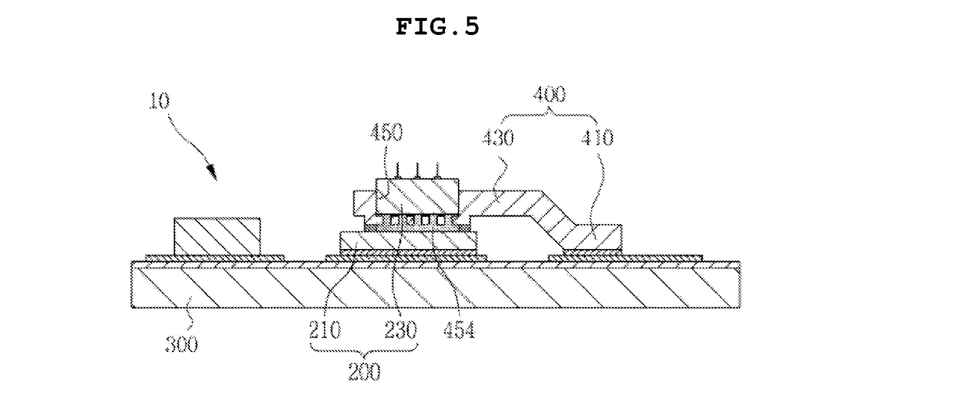
FIG. 5 is a view illustrating a cross section of the lead frame of FIG. 4.
Figure 6:
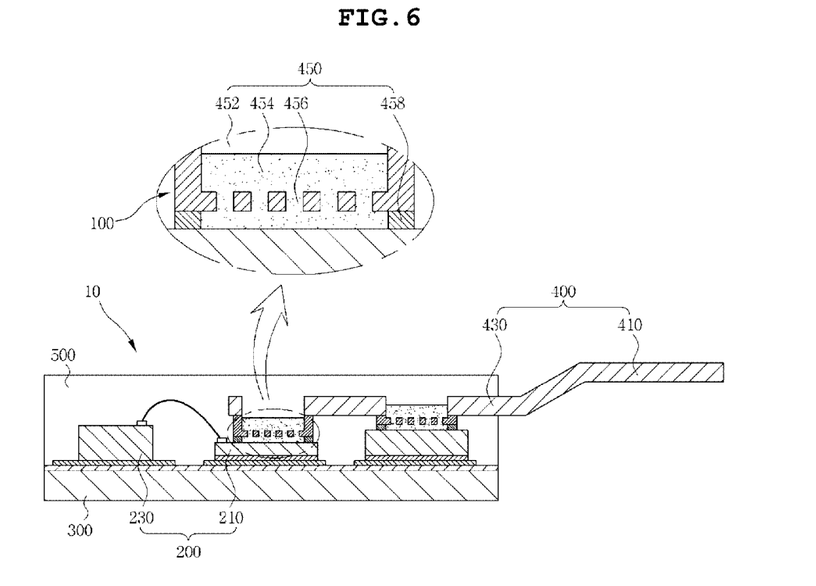
FIG. 6 is a cross-sectional view of a semiconductor module package according to a second exemplary embodiment of the present disclosure.
Figure 7:
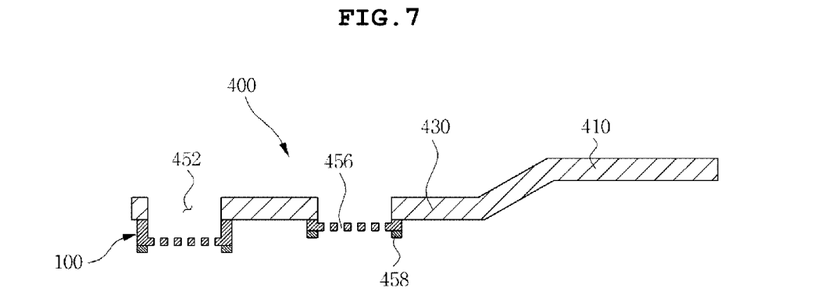
FIG. 7 is a view illustrating a cross section of FIG. 6.

Hereinafter, exemplary embodiments of the present disclosure will be described in detail with reference to the accompanying drawings. FIG. 1 is a cross-sectional view of a semiconductor module package according to an exemplary embodiment of the present disclosure, FIG. 2 is a perspective view of a lead frame of FIG. 1, FIG. 3 is a view illustrating a cross section of the lead frame of FIG. 2, FIG. 4 is a cross-sectional view illustrating a case in which a semiconductor device is inserted into a slit space according to deformation of the semiconductor module package of FIG. 1, FIG. 5 is a view illustrating a cross section of the lead frame of FIG. 4, FIG. 6 is a cross-sectional view of a semiconductor module package according to a second exemplary embodiment of the present disclosure, FIG. 7 is a view illustrating a cross section of FIG. 6, and FIGS. 8 to 12 are views illustrating a method of manufacturing a semiconductor module package according to an exemplary embodiment of the present disclosure.

The semiconductor module package 10 according to an exemplary embodiment of the present disclosure includes a base substrate 300 formed by mounting one or more first semiconductor devices 210 thereon; a lead frame 400 formed on a top surface of the first semiconductor device 210 and having an inlet 452 formed to inject a solder paste 454; and a space 458 inserted between the first semiconductor device 210 and the lead frame 400 to form a separation space.

The base substrate 300 forms a conductor pattern. The base substrate 300 may be a printed circuit board, a ceramic substrate, or a metal board having an anodized layer, but is not particularly limited thereto. The base substrate 300, which is a circuit board on which one or more circuit layers including a connection pad is formed on an insulating layer, may be the printed circuit board. Although the present drawing shows a case in which a specific configuration of an internal circuit pattern is omitted for convenience of explanation, the circuit board on which one or more circuit layers are formed on the insulating layer is used as the base substrate.

The base substrate 300 may have a connection pad (not shown) formed on an insulating layer (not shown). The connection pad (not shown) may be connected to an electronic component, a semiconductor device 200, and the lead frame 400.

A heat sink or a heat dissipating plate (not shown) dissipating heat to the outside may be formed on a lower end portion of the base substrate 300. The base substrate 300 may discharge the heat generated from the electronic component and the semiconductor device 200 to the outside through the heat sink or the heat dissipating plate (not shown). In this case, the heat sink or the heat dissipating plate (not shown) may be made of a material such as a metal, an aluminum alloy, or the like discharging the heat to the outside.

Referring to FIGS. 1 to 3, the lead frame 400 may be formed to be connected to any one of the base substrate 300, the electronic component, the semiconductor device 200, and the connection pad. The lead frame 400 is configured to include a plurality of leads, where the respective leads may include an external lead 410 connected to an external base substrate (not shown) and an internal lead 430 connected to the electronic component. The lead frame uses a special copper alloy, or the like made by using copper as a main raw material and mixing nickel, silicon, and phosphorus therewith.

When a plurality of first semiconductor devices (insulated gate bipolar transistor (IGBT), metal-oxide semiconductor field-effect transistor (MOSFET), fast recovery diode (FRD), diode) are disposed in a different kinds from each other, the lead frame 400 removes height steps of the first semiconductor devices 210. That is, the lead frame 400 is bent against the step height of the first semiconductor device 210 to thereby maintain a constant height. The lead frame 400 may be electrically connected to the electronic component and the semiconductor device 200.

The external lead frame 410 may refer to a portion exposed to an exterior of the mold part 500 to be described below and the internal lead frame 430 may refer to a portion disposed in the mold part 500. The external lead frame 410 is formed to protrude to a radial outer side of the mold part 500. The external frame may be formed by being upwardly bent at one protruded end. In this case, the external lead frame is formed to be bent by performing a trim and a forming (see FIG. 2). In this case, the external lead frame 410 may be bent to be connected to the base substrate 300 and the electronic component (see FIGS. 4 and 5).

The internal lead frame 430 may be mounted on one surface of the electronic component and the semiconductor device 200 and may be electrically connected thereto. In this case, the internal lead frame 430 may be electrically connected to the electronic component and the semiconductor device 200 by the wire bonding. This is not to limit the electrical connection between the internal lead frame 430, and the electronic component and the semiconductor device 200 to the above-mentioned electrical connection. The top surface of the lead frame 400 may be provided with mounting electrodes for mounting the electronic component and the semiconductor device 200 or circuit patterns (not shown) for electrically connecting the mounting electrodes to each other.

The first semiconductor device 210 is formed on a lower end portion of the internal lead frame 430. In this case, the internal lead frame 430 is formed by being bent to correspond to a height of the first semiconductor device 210. That is, the internal lead frame 430 is formed by being bent to maintain a constant height for the height of the first semiconductor device 210.

The internal lead frame 430 has a slit space 450 formed to correspond to the top surface of the first semiconductor device 210. The slit space 450 has an inlet 452 into which the solder paste 454 is injected and a through via hole 456 in which the solder paste 454 is injected into an inner portion through the inlet 452 (see FIGS. 2 and 3).

The inlet 452 provides a passage in which the solder paste 454 is injected. The inlet 452 is formed to correspond to the top surface of the first semiconductor device 210. The inlet 452 allows the first semiconductor device 210 and the lead frame 430 to be electrically in contact with the solder paste 454. That is, electrical reliability may be improved.

The through via hole 456 is formed in a lower end portion of the inlet 452. The through via hole 456 is formed to penetrate through the internal lead frame 430. That is, the through via hole 456 penetrates through the lead frame 400 while being formed in a lower end portion of the slit space 450. The through via hole 456 allows the solder paste 454 to be filled up to a height of a space 458 to be described below. A plurality of through via holes 456 are uniformly formed. This is to allow the solder paste 454 to rapidly and uniformly fill an interval between the first semiconductor device 210 and the lead frame 400.

The spaces 458 are formed along an outer peripheral surface of the through via hole 456 and are formed to have the same height. This is to form a constant height of the solder paste 454. The solder paste 454 is uniformly injected, such that electrical reliability is improved.

Depending on a bonding form between the space 458 and the lead frame 400, various changes may be performed. The space 458 may be made of a material having adhesion on both surfaces thereof. The material of the space 458 is not particularly limited, but may be an optical clear adhesive (OCA) or a double adhesive tape (DAT). In addition, the space 458 may be formed to be removable to the lead frame 400. In addition, the space 458 may be formed integrally with the lead frame 400 and may have an adhesive formed on a lower end portion thereof. The space 458 is fixed on the top surface of the first semiconductor device 210 using adhesion. This prevents distortion at the time of bonding the solder paste 454. In addition, the space 458 also serves as a dam preventing the solder paste 454 from flowing out.

The semiconductor device 200 may include various devices such as passive devices, active devices, and the like. The semiconductor device 200 includes a first semiconductor device 210 and a second semiconductor device 230. The first semiconductor device 210 and the second semiconductor device 230 may be used as at least one of a power device and a control device. This is only an example, and is not to limit a kind of semiconductor device 200 mounted on a semiconductor module package 10 (see FIG. 1).

One or more first semiconductor devices 210 are formed on the top surface of the base substrate 300. The first semiconductor device 210 is formed by being inserted into or stacked on the base substrate 300.

As the first semiconductor device 210, one of the insulated gate bipolar transistor (IGBT), the MOSFET, the FRD, the diode, and the like which are power device series may be used. For example, when the IGBT device (having a height of 70 µm) and the FRD device (having a height of 150 µm to 200 µm), which are the first semiconductor device 210, are mounted on the base substrate 300, a step height of 80 µm to 120 µm may be generated. In order to remove the above-mentioned step, the lead frame 400 is formed by being bent to correspond to the height of the first semiconductor device 210.

The second semiconductor device 230 is electrically connected to the lead frame 400 and the first semiconductor device 210. As the second semiconductor device 230, a control integrated circuit (IC) of a control device series is used. The second semiconductor device 230 prevents a sharp change in a current flowing in the device. The second semiconductor device 230 may be formed to be mounted on the top surface of the base substrate 300 or may be formed to be inserted into the base substrate 300. The second semiconductor device 230 uses power less than the first semiconductor device 210. This is to allow the second semiconductor device 230 to prevent a sharp change in a current and a voltage of the first semiconductor device 210.

The second semiconductor device 230 controls the current and the voltage supplied from the outside. The second semiconductor device 230 serves to absorb a surge voltage or ringing voltage. In this case, as the second semiconductor device 230, a snubber may be used. This is not to limit the second semiconductor device 230 to the snubber. A plurality of semiconductor devices 200 may be mounted in the semiconductor module package 10.

The second semiconductor device 230 may be mounted to be inserted into the slit space 450 (see FIGS. 4 and 5). In this case, the second semiconductor device 230 has improved electrical conduction even in spite of an electrical connection and external impact. In addition, the second semiconductor device 230 may provide a compact semiconductor module package.

The molding part 500 is formed to apply the first semiconductor device 210 and a portion of the lead frame 400. The molding part 500 may be made of silicone gel, an epoxy molded compound (EMC), or the like, but is not particularly limited thereto. The molding part 500 may be formed to expose one surface of the base substrate 300.

Hereinafter, a semiconductor module package according to a second exemplary embodiment of the present disclosure will be described with reference to FIGS. 6 and 7. Particularly, a description of the same components as those according to an exemplary embodiment of the present disclosure will be omitted, and a structure of a lead frame 400 according to a second exemplary embodiment of the present disclosure will be described in detail.

The lead frame 400 has an adjusting member 100 formed to protrude to a lower end portion thereof so as to maintain horizontally with the top surface of the first semiconductor device 210. The inlet 452 into which the solder paste 454 is injected is formed in an upper end portion of the lead frame. The inlet 452 serves as a passage into which the solder paste 454 is injected. The inlet 452 is formed in the top surface of the first semiconductor device 210. The inlet 452 provides an area that the first semiconductor device and the lead frame 430 are electrically in contact with each other. That is, electrical reliability is improved.

The adjusting member 100 is formed to correspond to the top surface of the first semiconductor device 210 and protrude to a lower portion. The adjusting member 100 may be made of the same material as or a material different from the lead frame 400. The adjusting member 100 is provided with a through via hole 456 corresponding to the inlet 452. The adjusting member 100 is formed to be penetrated through so that the solder paste 454 is injected into an inner portion.

The adjusting member 100 allows the solder paste 454 to have a constant height. A solder paste 454 (adhesive material) is formed between the adjusting member 100 and the top surface of the semiconductor device 200. The adjusting member 100 has the solder paste 454 formed thereon so that the first semiconductor device 210 may perform electrical conduction and heat dissipation. The solder paste 454 uniformly fills a distance between the lower end portion of the adjusting member 100 and the top surface of the first semiconductor device 210. The adjusting member 100 forms an applied thickness of the solder paste 454 to be constant. This is to allow the thickness of the solder paste 454 to be constant and improve electrical reliability. In addition, this may prevent an occurrence of concentrated stress and concentration of heating portions, which are problems that occur at the time of differently forming the thickness of the solder paste 454, in advance. The adjusting member 100 is formed to be adjusted depending on the height step of the first semiconductor device 210. That is, by adjusting a length of the adjusting member 100, a filling height of the solder paste 454 is formed to be constant.

Referring to FIGS. 8 to 12, a method of manufacturing a semiconductor module package according to an exemplary embodiment of the present disclosure includes: preparing a base substrate 300 on which one or more first semiconductor devices 210 are mounted; attaching a space to an upper end of the first semiconductor device 210 along a mounting portion; allowing a lead frame 400 to be in contact with an upper end portion of the space 458; injecting a solder paste 454 into an inlet 452 of the lead frame 400; and filling, by the solder paste 454, a distance between the first semiconductor device 210 and the lead frame 400.

Figure 8:
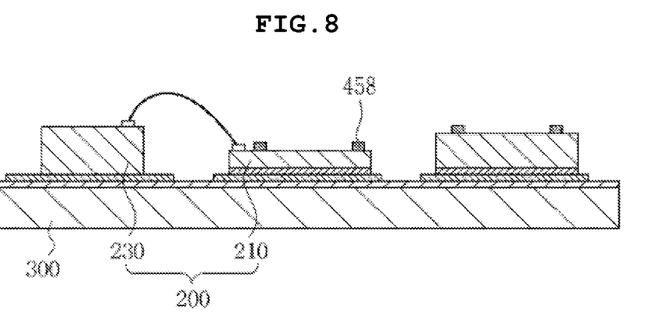
FIGS. 8 to 12 are views illustrating a method of manufacturing a semiconductor module package according to an exemplary embodiment of the present disclosure.

FIG. 8 is a view showing a case in which the space is fixed on a top surface of the first semiconductor device. One or more first semiconductor devices 210 are mounted on a top surface of the base substrate 300. A second semiconductor device 230 is mounted on an end portion of one side of the base substrate 300. The second semiconductor device 230 is connected to the first semiconductor device 210 by a wire bonding. The space 458 is attached onto the top surface of the first semiconductor device 210. In this case, the space 458 has a constant height. The space is attached using a double adhesive. The space may be appropriately attached using an optical clear adhesive (OCA), a double adhesive tape (DAT), or the like. This is to prevent damage for the semiconductor device 200 due to heat at the time of soldering of the solder paste 454 and a movement of the semiconductor device due to heat.

Figure 9:
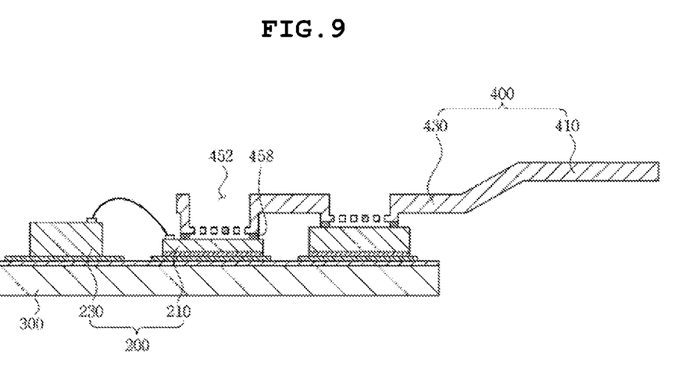

FIG. 9 is a view showing a case in which the lead frame is fixed on a top surface of the space. The lead frame 400 is bent depending on a position of the first semiconductor device 210. The lead frame 400 is disposed on the top surface of the space 458. In this case, the first semiconductor device 210 and a lower end portion of the lead frame 400 have the same height as each other. That is, the lead frame 400 is formed to be bent and in contact with the top surface of the space 458. A portion of the lead frame 400 is formed to be bent by trimming process and a forming process.

Figure 10:
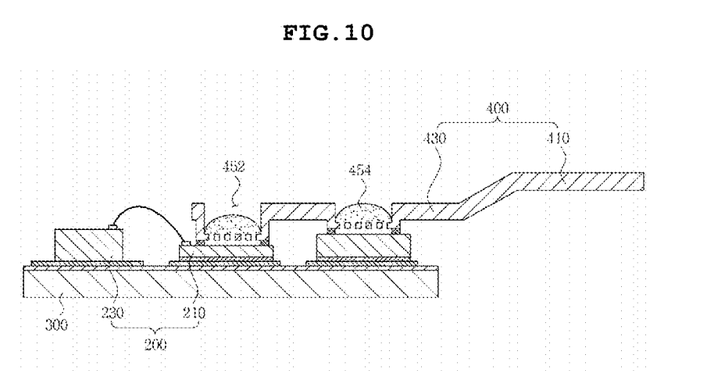
Figure 11:
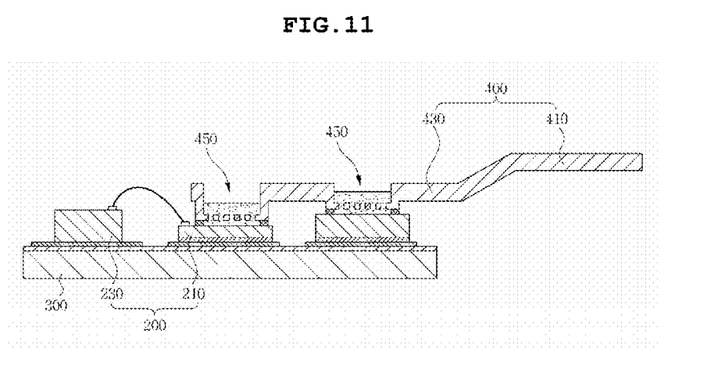

FIG. 10 is a view showing a case in which the solder paste is injected into the inlet of the lead frame. The solder paste 454 is injected through the inlet 452 formed in the upper end portion of the lead frame 400. In this case, the solder paste 454 may be made of an epoxy resin, a silicon resin, and the like. FIG. 11 is a view showing a case in which an inner portion is filled by soldering the solder paste. The inner portion is filled with the solder paste 454 through the through via hole 456 by soldering (melting) the solder paste 454. That is, a gap between the lead frame 400 and the first semiconductor device 210 is filled. Damage for the semiconductor device 200 due to heat generated at the time of filling the solder paste 454 is prevented. Moreover, a breakage (scattering) of the semiconductor device 200 due to heat may also be prevented.

Figure 12:
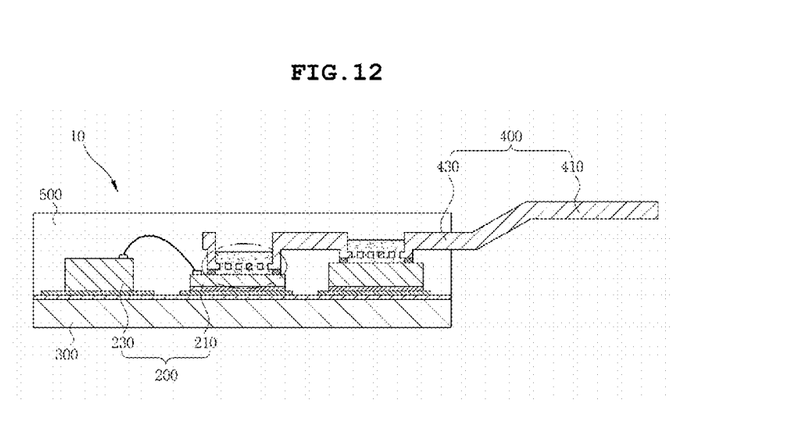

FIG. 12 is a view showing a case in which the molding part is formed. The molding part 500 is formed to apply the first semiconductor device 210 and a portion of the lead frame 400. The molding part 500 may be made of silicone gel, an epoxy molded compound (EMC), or the like, but is not particularly limited thereto. The molding part 500 may be formed to expose one surface of the base substrate 300.

As set forth above, according to the exemplary embodiments of the present disclosure, the semiconductor module package may suppress a phenomenon in which heating is concentrated on the lead frame and the solder resist by forming the space between the semiconductor device and the lead frame.

In addition, the semiconductor module package according to an exemplary embodiment of the present disclosure may prevent damage for the semiconductor device caused by the high temperature generated at the time of bonding the solder paste by forming the space between the semiconductor device and the lead frame.

In addition, the semiconductor module package according to an exemplary embodiment of the present disclosure may prevent a breakage (scattering) phenomenon of the semiconductor device caused by the high temperature generated at the time of bonding the solder paste in advance by forming the space between the semiconductor device and the lead frame.

In addition, the semiconductor module package according to an exemplary embodiment of the present disclosure may maintain a constant bonding height of the solder paste part formed between the semiconductor device and the supporting frame by forming the space between the semiconductor device and the lead frame.

In addition, the semiconductor module package according to an exemplary embodiment of the present disclosure may design the circuit pattern by a multilayer heat dissipation substrate by forming the space between the semiconductor device and the lead frame.

In addition, the semiconductor module package according to an exemplary embodiment of the present disclosure may decrease an electrical error generated between a plurality of semiconductor devices by forming the space between the semiconductor device and the lead frame.

In addition, the semiconductor module package according to an exemplary embodiment of the present disclosure may easily mount the lead frame by forming the space between the semiconductor device and the lead frame.

In addition, the semiconductor module package according to an exemplary embodiment of the present disclosure may solve a heat concentrating phenomenon to improve heat dissipating characteristics of the semiconductor device by forming the space between the semiconductor device and the lead frame.

In addition, the semiconductor module package according to an exemplary embodiment of the present disclosure may prevent a distortion phenomenon caused by heating the solder paste in advance by forming the space between the semiconductor device and the lead frame.

In addition, the semiconductor module package according to an exemplary embodiment of the present disclosure may prevent the solder paste from flowing out the semiconductor device by forming the space between the semiconductor device and the lead frame.

In addition, the semiconductor module package according to an exemplary embodiment of the present disclosure may improve heat discharging efficiency through the lead frame to improve reliability of the product by forming the space between the semiconductor device and the lead frame.

Although the embodiments of the present disclosure have been disclosed for illustrative purposes, it will be appreciated that the present disclosure is not limited thereto, and those skilled in the art will appreciate that various modifications, additions and substitutions are possible, without departing from the scope and spirit of the disclosure.

Accordingly, any and all modifications, variations or equivalent arrangements should be considered to be within the scope of the disclosure, and the detailed scope of the disclosure will be disclosed by the accompanying claims.

What is claimed is:

1. A semiconductor module package comprising:
    a base substrate formed by mounting one or more first semiconductor devices thereon;
    a lead frame formed on a top surface of the first semiconductor device and having an inlet formed to inject a solder paste; and
    a space inserted between the first semiconductor device and the lead frame to form a separation space,
    wherein the solder paste is filled in the separation space, the lead frame includes the inlet injecting the solder paste and a through via formed in a lower end portion of the inlet and allowing the solder paste to flow out, and
    the space is formed along an outer peripheral surface of the through via and serves as a dam, preventing the solder paste from flowing out.

2. The semiconductor module package of claim 1, wherein the lead frame is formed by being bent to correspond to top surfaces of one or more of the first semiconductor devices, and is formed so that a second semiconductor device is provided in the inlet.

3. The semiconductor module package of claim 1, wherein the space is formed to have the same height.

4. The semiconductor module package of claim 3, wherein the space is made of a material having adhesion on both surfaces thereof.

5. The semiconductor module package of claim 2, wherein the space is formed to be removable.

6. The semiconductor module package of claim 2, wherein the space is formed integrally with the lead frame and has an adhesive formed on a lower end portion thereof.

7. A semiconductor module package comprising:
    a base substrate formed by mounting one or more first semiconductor devices thereon;
    a lead frame formed on a top surface of the first semiconductor device and having an inlet formed to inject a solder paste; and
    a space inserted between the first semiconductor device and the lead frame to form a separation space,
    wherein the solder paste is filled in the separation space, and
    wherein the lead frame and the space have an adjusting member formed therebetween, the adjusting member having one or more through via holes formed therein.

8. The semiconductor module package of claim 7, wherein the adjusting member is formed to correspond to the space and allows a constant height that the solder paste is filled to be formed.

9. A method of manufacturing a semiconductor module package, the method comprising:
    preparing a base substrate on which one or more first semiconductor devices are mounted;
    attaching a space to an upper end of the first semiconductor device along a mounting portion;
    allowing a lead frame to be in contact with an upper end portion of the space;
    injecting a solder paste into an inlet of the lead frame; and
    filling, with the solder paste, a distance between the first semiconductor device and the lead frame,
    wherein the lead frame includes a through via formed in a lower end portion of the inlet and allowing the solder paste to flow out, and
    the space is formed along an outer peripheral surface of the through via and serves as a dam, preventing the solder paste from flowing out.

10. The method of claim 9, further comprising, after the filling, by the solder paste, of the distance between the first semiconductor device and the lead frame, inserting and fixing a second semiconductor device into the inlet.

11. The method of claim 9, wherein in the injecting of the solder paste into an inlet of the lead frame, the solder paste is made of an epoxy resin and a silicon resin.

12. The method of claim 9, wherein the allowing of the lead frame to be in contact with an upper end portion of the space includes bending a portion of the lead frame by performing a trimming process and a forming process for the portion of the lead frame.

13. The method of claim 10, wherein the electrically connecting of the second semiconductor device to the first semiconductor device and the lead frame includes electrically connecting the second semiconductor device to the first semiconductor device and the lead frame using a wire.

14. The method of claim 9, wherein the attaching of the space to an upper end of the first semiconductor device along a mounting portion includes attaching the space using a double adhesive.

15. The method of claim 9, wherein the attaching of a space to an upper end of the first semiconductor device along a mounting portion includes attaching the space using an optical clear adhesive (OCA) and a double adhesive tape (DAT).

* * * * *